United States Patent
Ri et al.

(10) Patent No.: US 10,006,669 B2
(45) Date of Patent: Jun. 26, 2018

(54) CRYOGENIC REFRIGERATOR AND COOLING METHOD

(75) Inventors: Zui Ri, Tokyo (JP); Pengda Yan, Tokyo (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 1245 days.

(21) Appl. No.: 13/703,232

(22) PCT Filed: Jun. 14, 2010

(86) PCT No.: PCT/JP2010/003941
§ 371 (c)(1),
(2), (4) Date: Jun. 28, 2013

(87) PCT Pub. No.: WO2011/158281
PCT Pub. Date: Dec. 22, 2011

(65) Prior Publication Data
US 2013/0285663 A1    Oct. 31, 2013

(51) Int. Cl.
*F25B 9/00* (2006.01)
*F25B 9/14* (2006.01)
*G01R 33/28* (2006.01)

(52) U.S. Cl.
CPC ............... *F25B 9/00* (2013.01); *F25B 9/14* (2013.01); *G01R 33/28* (2013.01)

(58) Field of Classification Search
CPC ...... F25B 2309/1411; F25B 2309/1418; F25B 2309/14181; F25B 9/00; F25B 9/12;
(Continued)

(56) References Cited

U.S. PATENT DOCUMENTS 4,622,823 A    11/1986   Ishizawa et al.
5,361,588 A    11/1994   Asami et al.
(Continued)

FOREIGN PATENT DOCUMENTS

JP    60-138369 A    7/1985
JP    03-070942 A    3/1991
(Continued)

OTHER PUBLICATIONS

International Preliminary Report on Patentability issued in PCT/JP2010/003941 dated Jan. 15, 2013.
(Continued)

*Primary Examiner* — Frantz Jules
*Assistant Examiner* — Erik Mendoza-Wilkenfe
(74) *Attorney, Agent, or Firm* — Michael Best & Friedrich LLP (57) ABSTRACT

A cryogenic refrigerator includes a refrigerator having a cylinder and a displacer movably arranged in the cylinder. The displacer is operative to provide intake of an operating gas into the cylinder and exhaust of the gas out of the cylinder. The refrigerator includes a compressor for compressing the operating gas. The compressor includes a low-pressure side to receive the gas exhausted from the cylinder and a high-pressure side to discharge the gas compressed in the compressor into the cylinder. The refrigerator includes a medium-pressure buffer volume connected to a high-pressure side or a low-pressure side of the compressor. The compressor adjusts a pressure of the buffer volume. The buffer volume is also connected to the cylinder.

26 Claims, 5 Drawing Sheets (58) Field of Classification Search
CPC ............... F25B 9/14; F25B 2309/1421; F25B 2309/1426; F25B 2309/1427; F25B 2309/1414; G01R 33/28
See application file for complete search history.

(56) References Cited

U.S. PATENT DOCUMENTS

| | | | | |
|---|---|---|---|---|
| 5,642,623 | A * | 7/1997 | Hiresaki | F25B 9/10 62/467 |
| 5,927,081 | A * | 7/1999 | Li | F25B 9/145 60/520 |
| 6,094,921 | A * | 8/2000 | Zhu | F25B 9/145 60/520 |
| 6,256,998 | B1 * | 7/2001 | Gao | F25B 9/145 62/6 |
| 2001/0032469 | A1 * | 10/2001 | Zhu | F25B 9/145 62/6 |
| 2002/0152758 | A1 * | 10/2002 | Longsworth | F25B 9/145 62/6 |
| 2005/0115247 | A1 * | 6/2005 | Gao | F25B 9/145 62/6 |
| 2008/0092588 | A1 * | 4/2008 | Xu | F25B 9/14 62/600 |
| 2011/0000225 | A1 * | 1/2011 | Xu | F25B 9/145 62/6 |
| 2012/0227417 | A1 * | 9/2012 | Chao | F25B 9/14 62/6 |

FOREIGN PATENT DOCUMENTS

| | | |
|---|---|---|
| JP | 2617681 B | 3/1997 |
| JP | 09-324958 A | 12/1997 |
| JP | 2001-317827 A | 11/2001 |

OTHER PUBLICATIONS

Office Action issued in Japanese Patent Application No. 2012-520152, dated Nov. 12, 2013.

* cited by examiner

CRYOGENIC REFRIGERATOR AND COOLING METHOD

BACKGROUND OF THE INVENTION

1. Field of the Invention

The present invention relates to a cryogenic refrigerator and a cooling method.

2. Description of the Related Art

For example, a cryogenic refrigerator using a Gifford-McMahon (GM) cycle or the like is known. The cryogenic refrigerator is provided with a compressor configured to inhale a low-pressure refrigerant gas exhausted from the refrigerator and exhale the gas as a high-pressure refrigerant gas into the refrigerator. Further, a rotary valve unit for controlling the flow of the refrigerant gas between the refrigerator and the compressor is embedded in the refrigerator. An intake valve for inhaling the refrigerant gas into the refrigerator and an exhaust valve for exhausting the refrigerant gas are formed in the rotary valve unit. The intake valve is provided for supplying the high-pressure refrigerant gas from the compressor into the refrigerator. The exhaust valve is provided for exhausting the low-pressure refrigerant gas from the refrigerator into the compressor.

SUMMARY OF THE INVENTION

According to an aspect of the present invention, there is provided a cryogenic refrigerator including a refrigerator including a cylinder and a displacer movably arranged in the cylinder, the displacer operative to provide intake of an operating gas into the cylinder and exhaust of the gas out of the cylinder; a compressor configured to compress the operating gas and comprising a low-pressure side to receive the gas exhausted from the cylinder and a high-pressure side to discharge the gas compressed in the compressor into the cylinder; and a medium-pressure buffer volume connected to at least one of the high-pressure side and the low-pressure side of the compressor such that the compressor adjusts a pressure of the buffer volume, the buffer volume connected to the cylinder.

According to another aspect of the present invention, there is provided a cooling method including a thermal cycle for generating coldness. The cycle includes an intake process for inhaling an operating gas from a high-pressure source into an expansion space; and an exhaust process for expanding the operating gas and exhausting the gas from the expansion space into a low-pressure source. The intake process includes a process for inhaling the gas from a medium-pressure source having a medium pressure between a pressure of the high-pressure source and a pressure of the low-pressure source into the expansion space. Before the exhaust process is started, the medium-pressure source is disconnected from the expansion space to increase the pressure of the medium-pressure source in order to reduce a differential pressure between the medium-pressure source and the expansion space.

According to still another aspect of the present invention, there is provided a cooling method including a thermal cycle for generating coldness. The cycle includes an intake process for inhaling an operating gas from a high-pressure source into an expansion space; and an exhaust process for expanding the operating gas and exhausting the gas from the expansion space into a low-pressure source. The exhaust process includes a process for exhausting the gas from the expansion space into a medium-pressure source having a medium pressure between a pressure of the high-pressure source and a pressure of the low-pressure source. Before the intake process is started, the medium-pressure source is disconnected from the expansion space to reduce a pressure of the medium-pressure source in order to reduce a differential pressure between the medium-pressure source and the expansion space.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

In a typical cryogenic refrigerator, a relatively large differential pressure, which corresponds to the differential pressure between the inlet and the outlet of the compressor, acts on the intake valve when the valve is opened. The same is true of the exhaust valve. The larger the differential pressure is, the larger the energy loss in the valve is. It is because a turbulence of the gas flow is generated when the gas passes through the valve, and the turbulence causes friction heat or the like causing the energy loss. To be more precise, the entropy of the flow increases. In consideration of such an energy loss, the refrigerator is provided with a relatively large compressor. However, as long as the same refrigeration capacity as that of such a large compressor can be obtained, it is desirable to use a compressor of lower power consumption for the purpose of energy conservation.

An object of the present invention is to provide a high energy-conservation cryogenic refrigerator and cooling method.

According to an embodiment of the present invention, there is provided a cryogenic refrigerator that includes a refrigerator including a displacer driven in a cylinder in order to inhale and exhaust an operating gas, a compressor for compressing a low-pressure operating gas exhausted from the cylinder to make the gas a high-pressure operating gas, and exhaling the gas into the cylinder, and a medium-pressure buffer volume connected to at least one of a high-pressure side and a low-pressure side of the compressor to adjust a pressure of the medium-pressure buffer volume by the compressor and also connected to the cylinder.

According to this embodiment, the differential pressure between the cylinder and the compressor can be reduced using the medium-pressure buffer volume. This can reduce the energy loss in the flow of the operating gas between the compressor and the cylinder. Thus, an energy-thrifty compressor can be adopted, so that an energy-efficient cryogenic refrigerator can be provided. Further, keeping the pressure of the buffer volume within the medium pressure range also contributes to the energy-conservation performance of the refrigerator.

Figure 1:
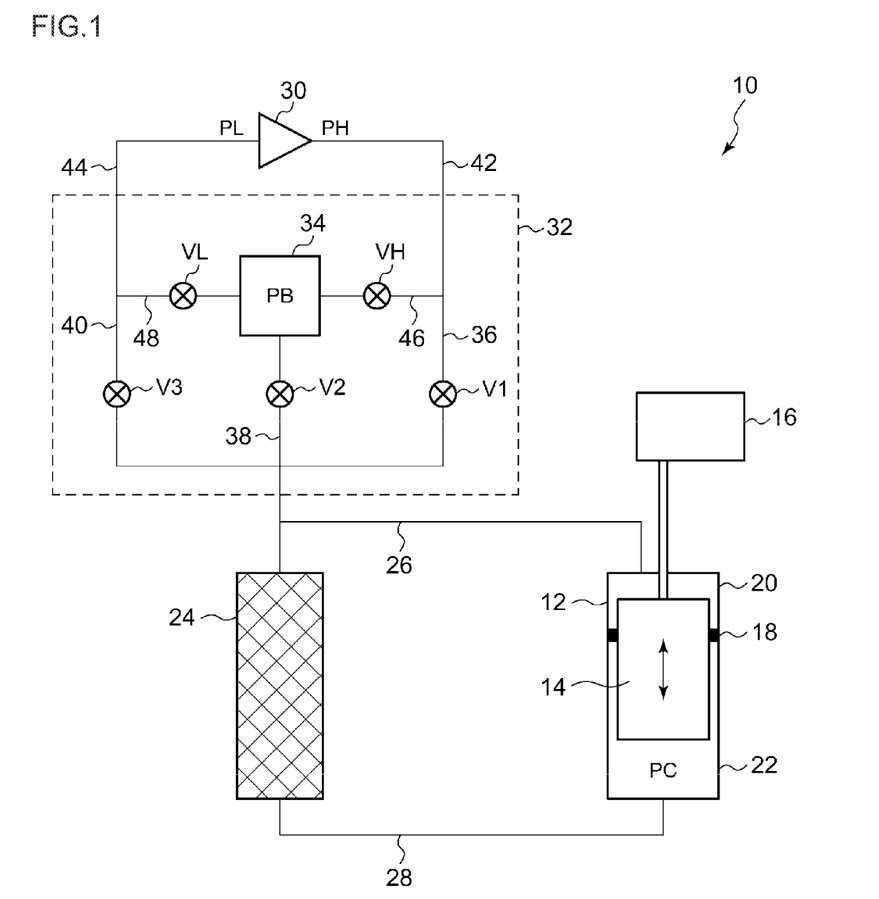
FIG. 1 is a schematic view illustrating the structure of a cryogenic refrigerator according to an embodiment of the present invention.

FIG. 1 is a schematic view illustrating the structure of a cryogenic refrigerator 10 according to an embodiment of the present invention. The cryogenic refrigerator 10 is a Gifford-McMahon type refrigerator (so-called GM refrigerator). It generates coldness by the GM cycle. The refrigerator 10 includes a displacer 14 mechanically driven at the inside of a cylinder 12. A cold head of the cryogenic refrigerator 10 includes the cylinder 12 and the displacer 14. The displacer 14 is reciprocated between a high-temperature end and a low-temperature end of the cylinder 12 by a displacer driving mechanism 16. The displacer driving mechanism 16 includes, for example, a motor, a crank, and a scotch yoke. The crank and the scotch yoke are configured to convert the rotary movement that is output from the motor into reciprocating movement and to transmit the reciprocating movement to the displacer 14. A seal 18 is positioned between the cylinder 12 and the displacer 14 to divide the cylinder 12 into an upper room 20 at the high-temperature side and an expansion room 22 at the low-temperature side. The operating gas pressure of the expansion room 22 may be hereinafter referred to as a cylinder pressure PC. A first gas flow path 26 connects the upper room 20 to a regenerator 24. A second gas flow path 28 connects the expansion room 22 to the regenerator 24. The operating gas is, for example, helium gas.

Note that, although the regenerator 24 is provided outside of the cylinder 12 in the example shown in the drawing, the regenerator 24 may be incorporated in the displacer 14. The cryogenic refrigerator 10 is not limited to a single stage refrigerator as shown in the drawing, and may be a refrigerator with a plurality of stages (for example, two stages) in which a respective displacer capable of reciprocating is included in each of a plurality of (for example, two) cylinders connected in series with each other. Further, the cryogenic refrigerator 10 may be configured to drive the displacer 14 using the pressure of the operating gas. The cryogenic refrigerator 10 may be configured to generate coldness by an appropriate thermal cycle any other than the GM cycle, such as the Solvay cycle.

The cryogenic refrigerator 10 further includes a compressor 30 and a pressure control unit 32. The compressor 30 is provided for circulating the operating gas. The compressor 30 receives and compresses the operating gas at a low pressure PL that has been exhausted from the cylinder 12. The compressor 30 then discharges and delivers the operating gas at a high pressure PH into the cylinder 12 again. A high-pressure pipe 42 and a low-pressure pipe 44 extend from an outlet and an inlet of the compressor 30, respectively. The high-pressure pipe 42 and the low-pressure pipe 44 connect the compressor 30 to the pressure control unit 32. The compressor 30 is separately provided from the pressure control unit 32. The compressor 30 and the pressure control unit 32 are connected to each other through the pipes. The compressor 30 is configured to inhale the operating gas at a substantially-fixed low pressure PL and to exhale the operating gas at a substantially-fixed high pressure PH. However, the compressor 30 may be configured to change at least one of the input pressure and the output pressure. For example, the compressor 30 may be controlled such that the differential pressure between the outlet and the inlet of the compressor 30 is maintained at a target differential pressure.

The pressure control unit 32 is provided between the cylinder 12 and the compressor 30 to connect the compressor 30 to the high-temperature end of the cylinder 12. The pressure control unit 32 periodically switches the connection between the compressor 30 and the cylinder 12 in synchronization with the reciprocation of the displacer 14 in order to implement the thermal cycle for generating coldness. In other words, the pressure control unit 32 connects the high-pressure side (or high-pressure port) of the compressor 30 to the cylinder 12 during an intake process for filling the cylinder 12 with the operating gas, while the pressure control unit 32 connects the low-pressure side (or low-pressure port) of the compressor 30 to the cylinder 12 during an exhaust process for discharging the operating gas from the cylinder 12. As described below, the pressure control unit 32 connects the cylinder 12 not only to one of the high-pressure source and the low-pressure source but also to a buffer volume 34.

The pressure control unit 32 includes at least one buffer volume 34, a high-pressure valve V1, a medium-pressure valve V2, and a low-pressure valve V3. The high-pressure valve V1 is provided in a high-pressure gas flow path 36 to communicate the high-pressure side of the compressor 30 with the upper room 20 of the cylinder 12. The medium-pressure valve V2 is provided in a medium-pressure gas flow path 38 to communicate the buffer volume 34 with the upper room 20 or the expansion room 22 of the cylinder 12. The low-pressure valve V3 is provided in a low-pressure gas flow path 40 to communicate the low-pressure side of the compressor 30 with the expansion room 22 of the cylinder 12.

The high-pressure valve V1, the medium-pressure valve V2, and the low-pressure valve V3 are provided in parallel with the cylinder 12 and the regenerator 24. By opening at least one of the high-pressure valve V1, the medium-pressure valve V2, and the low-pressure valve V3, at least one of a high-pressure source, a medium-pressure source, and a low-pressure source is communicated with the cylinder 12 and the regenerator 24 in response to the opened valve. Accordingly, the cryogenic refrigerator 10 includes an operating gas source including the high-pressure source, the medium-pressure source, and the low-pressure source that can selectively be communicated with the cylinder 12.

An end of the high-pressure gas passage 36 is connected to the high-pressure pipe 42 that extends from the outlet of the compressor 30. The other end of the high-pressure passage 36 is connected to the first gas passage 26. An end of the medium-pressure gas passage 38 is connected to the buffer volume 34. The other end of the medium-pressure passage 38 is connected to the first passage 26. An end of the low-pressure gas passage 40 is connected to the low-pressure pipe 44 that extends from the inlet of the compressor 30. The other end of the low-pressure passage 40 is connected to the first passage 26.

The buffer volume 34 is connected to at least one of the high-pressure side and the low-pressure side of the compressor 30 so that the compressor 30 regulates the pressure of the buffer volume 34 at a medium pressure between the high pressure PH and the low pressure PL. The pressure of the buffer volume 34 may be hereinafter referred to as a buffer pressure PB. As described below with reference to FIG. 2, the buffer pressure PB is controlled by the pressure control unit 32 to be within a medium-pressure range during the thermal cycle. The upper limit of the medium-pressure range is lower than the high pressure PH of the compressor 30, and the lower limit of the medium-pressure range is higher than the low pressure PL of the compressor 30. Consequently, the buffer volume 34 acts as the medium-pressure source adjusted by at least one of the high-pressure source for supplying the operating gas to an expansion space and the low-pressure source for exhausting the operating gas from the expansion space.

The buffer pressure PB is regulated to return to a set pressure, for example, during at least apart of the time period when the medium-pressure valve V2 is closed. The compressor 30 can restore the buffer pressure PB that has been increased or reduced due to the communication between the buffer volume 34 and the cylinder 12. Thus, even a relatively small buffer volume 34 can sufficiently function as an operating gas source. The size of the cryogenic refrigerator 10 can be reduced by making the volume of the buffer volume 34 smaller than that of the cylinder 12 or that of the expansion room 22, for example.

On the other hand, when the compressor 30 does not restore the buffer pressure PB, it is possibly necessary to provide an appropriately large-capacity buffer. When it is not so important to downsize the buffer, the buffer pressure PB does not need to be restored. In that case, it is not necessary to provide a communication path for communicating the buffer volume 34 with the compressor 30.

The set pressure of the buffer volume 34 is set for reducing the energy loss caused by the flow of the operating gas through each of the high-pressure valve V1, the medium-pressure valve V2, and the low-pressure valve V3 in consideration of the differential pressure that acts on each of the valves when it is opened. As shown in the drawing, when a single buffer volume 34 is provided, an average value PM of the high pressure PH and the low pressure PL of the compressor 30 can be used as the set pressure of the buffer volume 34. Alternatively, the set pressure may be set higher or lower than the average value PM.

The buffer volume 34 is provided in a communication path for communicating the high-pressure side with the low-pressure side of the compressor 30. The buffer volume 34 can communicate with the high-pressure side or the low-pressure side of the compressor 30 regardless of whether the high-pressure valve V1 and the low-pressure valve V3 are opened or closed. Specifically, the buffer volume 34 is arranged to be capable of communicating with the high-pressure side of the compressor 30 when the high-pressure valve V1 is closed. In addition, the buffer volume 34 is arranged to be capable of communicating with the low-pressure side of the compressor 30 when the low-pressure valve V3 is closed. Thus, the pressure of the buffer volume 34 can be adjusted in synchronization with the thermal cycle of the cryogenic refrigerator 10. Alternatively, the buffer pressure PB may be independently adjusted without being bound to the timing of the steps in the thermal cycle.

One end of a first communication path 46 and one end of a second communication path 48 are both connected to the buffer volume 34. Either of the first communication path 46 or the second communication path 48 may be omitted and the buffer volume 34 may communicate with either of the high-pressure side or the low-pressure side of the compressor 30. In an embodiment, the buffer volume 34 is a buffer tank. As shown in the drawing, the buffer volume 34 may be separately provided from the compressor 30 and the cylinder 12 and the buffer volume 34 may be connected to the compressor 30 and the cylinder 12 through a pipe and/or a flow path. Alternatively, the buffer volume 34 may be incorporated in the cylinder 12 or the displacer driving mechanism 16. The buffer volume 34 may be incorporated in the compressor 30.

The other end of the first communication path 46 is connected to the high-pressure passage 36. The other end of the second communication path 48 is connected to the low-pressure passage 40. In other words, the first communication path 46 branches from the high-pressure passage 36 at an upstream of the high-pressure valve V1. The second communication path 48 branches from the low-pressure passage 40 at a downstream of the low-pressure valve V3. Herein, the "upstream" denotes the side near to the outlet of the compressor 30 in a circulation pathway of the operating gas. The circulation pathway delivers the operating gas from the outlet of the compressor 30 and returns it to the inlet of the compressor 30 through the cylinder 12 and the regenerator 24. The "downstream" denotes the side near to the inlet of the compressor 30 in the pathway. Note that the first communication path 46 may branch from the high-pressure path 36 at the downstream of the high-pressure valve V1, and the second communication path 48 may branch from the low-pressure path 40 at the upstream of the low-pressure valve V3.

The communication path for the buffer volume 34 includes a flow adjuster for adjusting the pressure of the buffer volume 34. In the embodiment shown in FIG. 1, the flow adjuster is a valve for adjusting the flow rate of the communication path. The flow adjuster adjusts the flow rate by controlling the timing for opening or closing the valve or the degree of opening of the valve. Using the valve as the flow adjuster can improve the control for adjusting the buffer pressure PB. Opening and closing the valve may provide a desired adjustment of the buffer pressure PB.

The pressure control unit 32 includes a first pressure-adjusting valve VH and a second pressure-adjusting valve VL for adjusting the pressure of the buffer volume 34. The first pressure-adjusting valve VH is provided in the first communication path 46. The second pressure-adjusting valve VL is provided in the second communication path 48. Either of the first pressure-adjusting valve VH or the second pressure-adjusting valve VL can be omitted. In that case, an orifice may be provided in place of at least one of the first pressure-adjusting valve VH and the second pressure-adjusting valve VL.

At least a part of the pressure control unit 32 may be incorporated in the cylinder 12 or the displacer driving mechanism 16 to mechanically operate in synchronization with the reciprocation of the displacer 14. For example, a rotary valve mechanism, which is configured to alternately open and close the high-pressure valve V1 and the low-pressure valve V3 in conjunction with the displacer driving mechanism 16, may be provided. In the rotary valve mechanism, the medium-pressure valve V2 may be formed so as to be temporarily opened before each of the high-pressure valve V1 and the low-pressure valve V3 is opened. Further, the first pressure-adjusting valve VH and the second pressure-adjusting valve VL may be formed in the rotary valve mechanism. Alternatively, at least a part of the pressure control unit 32 may be incorporated in the compressor 30.

Further, at least one of the valves included in the pressure control unit 32 may be a control valve that is individually opened and closed. A controller (not shown in the drawing) for controlling the opening and closing of the control valve may be provided with the cryogenic refrigerator 10. This controller may be a controller configured to control the cryogenic refrigerator 10. For example, each of the first pressure-adjusting valve VH and the second pressure-adjusting valve VL may be a control valve that can be opened and closed independently from the other valves as needed.

A refrigeration cycle includes an intake process for inhaling an operating gas from a high-pressure source into a space for expansion and an exhaust process for exhausting the expanded operating gas from the expansion space into a low-pressure source. In the present embodiment, the intake process includes a process for inhaling the gas from a medium-pressure source into the expansion space. The exhaust process includes a process for exhausting the gas from the expansion space into the medium-pressure source. In an embodiment, the medium-pressure source is the buffer volume 34. The intake process and the exhaust process are alternately performed. Just after one of the intake process and the exhaust process is performed, the other process may be subsequently performed. Alternatively, the intake process and the exhaust process may be alternately performed while an interval is put between the intake process and the exhaust process. In the interval, both of the intake process and the exhaust process are not performed.

In an embodiment, the medium-pressure source is used as an operating gas source at the start of the intake process. The gas source is switched from the medium-pressure source to the high-pressure source in the middle of the intake process. The gas is inhaled from the high-pressure source at the completion of the intake process. Further, in an embodiment, the medium-pressure source is used as the operating gas source at the start of the exhaust process. The gas source is switched from the medium-pressure source to the low-pressure source in the middle of the exhaust process. The gas is exhausted into the low-pressure source at the completion of the exhaust process. The operating gas source may be switched in a manner that the intake from the high-pressure source (or the exhaust into the low-pressure source) is started after the intake from the medium-pressure source (or the exhaust into the medium-pressure source) is completed. The switching of the operating gas source may include a combined use of the sources where the intake from the high-pressure source (or the exhaust into the low-pressure source) is started before the intake from (or the exhaust into) the medium-pressure source is completed. The operating gas source may be switched in at least one of the intake process and the exhaust process.

In an embodiment, the buffer pressure PB is regulated in substantial conjunction with the cylinder pressure PC. Therefore, the pressure of the buffer volume 34 is adjusted to a relatively low pressure within the medium-pressure range when the cylinder 12 exhausts a low-pressure operating gas. Also, the buffer pressure PB is a relatively high pressure in the range when the cylinder 12 inhales a high-pressure operating gas. As described above, the medium-pressure range is a range for adjusting the buffer pressure PB, which is defined by a maximum buffer pressure that is lower than the high pressure PH of the compressor 30 and a minimum buffer pressure that is higher than the low pressure PL of the compressor 30.

In such a manner, exhausting the gas from the cylinder 12 reduces the cylinder pressure PC, and thereby reduces the buffer pressure PB to some extent. Likewise, inhaling the gas into the cylinder 12 increases the cylinder pressure PC, and thereby increases the buffer pressure PB to some extent. Thus, the differential pressure between the buffer pressure PB and the cylinder pressure PC can relatively be reduced. Consequently, the energy loss in the medium-pressure gas flow path 38 can be suppressed.

The buffer pressure PB is preferably adjusted to a first set pressure just before the intake process is started. The first set pressure is at a relatively-low pressure. The buffer pressure PB is controlled to be within a low-pressure zone in the medium-pressure range during the intake process. The buffer pressure PB is then adjusted to a second set pressure just before the exhaust process is started. The second set pressure is at a relatively-high pressure. The buffer pressure PB is controlled to be within a high-pressure zone in the medium-pressure range during the exhaust process. Further, the buffer pressure PB is adjusted to the relatively-low first set pressure again just before the intake process is started. The first set pressure may be equal to the lower limit value of the high-pressure zone, and the second set pressure may be equal to the upper limit value of the low-pressure zone. The low-pressure zone may overlap with the high-pressure zone since the upper limit value of the low-pressure zone may be set larger than the lower limit value of the high-pressure zone. Alternatively, setting the upper limit value of the low-pressure zone in agreement with the lower limit value of the high-pressure zone (i.e., making the first set pressure equal to the second set pressure) may divide the medium-pressure range into the low-pressure zone and the high-pressure zone.

Figure 2:
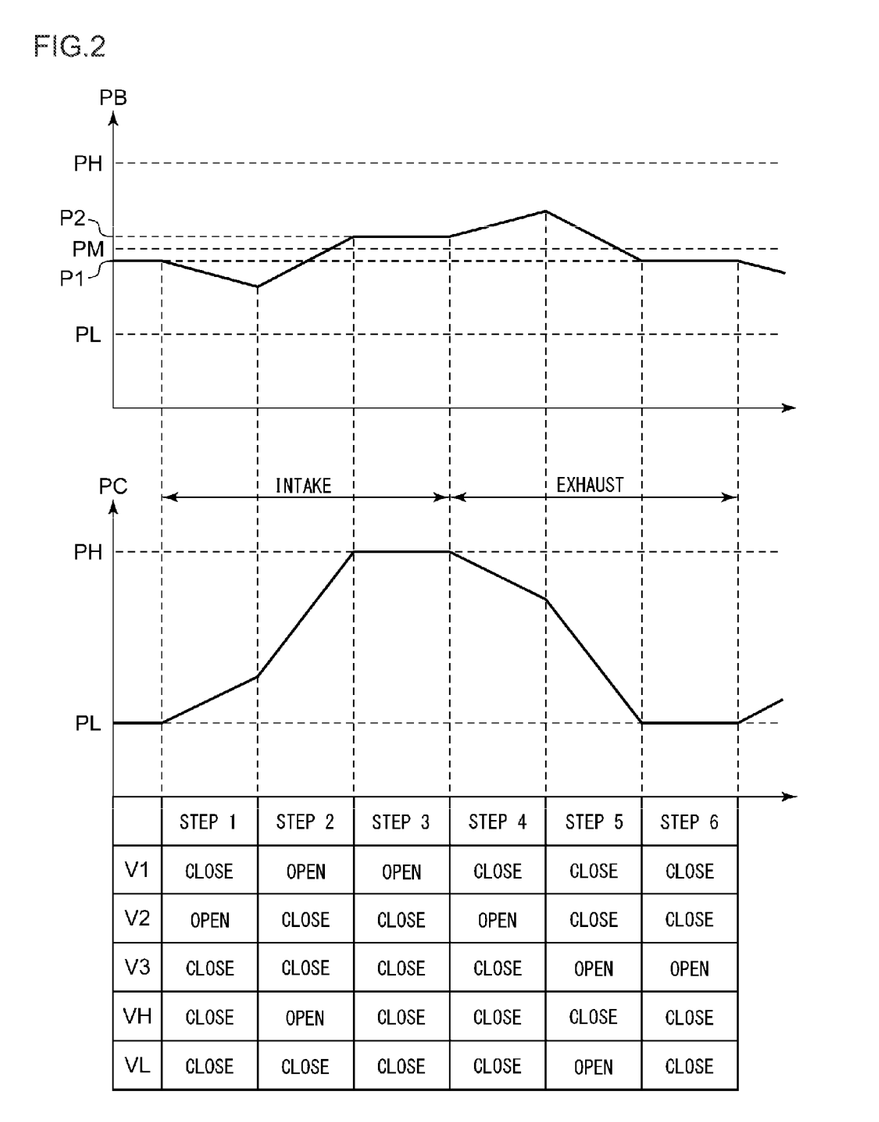
FIG. 2 is a schematic view illustrating an exemplary operation of the cryogenic refrigerator according to an embodiment of the present invention.

FIG. 2 is a schematic view illustrating an exemplary operation of the cryogenic refrigerator 10 according to an embodiment of the present invention. An example of the opening/closing states of each valve in the pressure control unit 32 in a thermal cycle is shown at the lower part of FIG. 2. The variation of the buffer pressure PB and the variation of the cylinder pressure PC in time due to the changes of the opening/closing states are shown at the upper part and at the middle part of FIG. 2, respectively. As shown in the drawing, the opening/closing states of the valves are sequentially switched to six stages from the steps 1 to 6 per a cycle in that example. The first half of steps 1 to 3 corresponds to the intake process, and the second half of steps 4 to 6 corresponds to the exhaust process.

In the exemplary operation shown in FIG. 2 (likewise, in the exemplary operation shown in FIG. 5), the buffer volume 34 is first communicated with the cylinder 12 before the high-pressure side of the compressor 30 is communicated with the cylinder 12 in the intake process. The buffer pressure PB increases the cylinder pressure PC. This reduces the differential pressure acting on the high-pressure valve V1. The buffer volume 34 is then disconnected from the cylinder 12 preferably before the opening of the high-pressure valve V1, or at the latest before the start of the exhaust process. After that, the operating gas is supplied from the compressor 30 to the buffer volume 34 in order to restore at least a part of the reduced amount of the buffer pressure PB. Consequently, the buffer pressure PB is increased to reduce the differential pressure between the cylinder pressure PC and the buffer pressure PB.

Further, the buffer volume 34 is communicated with the cylinder 12 before the low-pressure side of the compressor 30 is communicated with the cylinder 12 in the exhaust process. The buffer pressure PB reduces the cylinder pressure PC. This reduces the differential pressure acting on the low-pressure valve V3. The buffer volume 34 is then disconnected from the cylinder 12 preferably before the opening of the low-pressure valve V3, or at the latest before the start of the intake process. The operating gas is exhausted from the buffer volume 34 to the compressor 30 in order to consume at least apart of the increased amount of the buffer pressure PB. The buffer pressure PB is reduced in order to reduce the differential pressure between the cylinder pressure PC and the buffer pressure PB. As described above, in the exemplary operation in FIG. 2, reducing the differential pressures acting on the high-pressure valve V1 and the low-pressure valve V3 by using the medium-pressure source, and restoring the operating gas pressure of the medium-pressure source are alternately repeated.

In particular, as shown in FIG. 2, the initial condition of the operating gas at the start of the intake process is that the buffer pressure PB is at the first set pressure P1 and the cylinder pressure PC is substantially equal to the low pressure PL of the compressor 30 because the exhaust process is completed. The first set pressure P1 is set lower than the average value PM of the low pressure PL and the high pressure PH of the compressor 30.

The valves are opened and closed to become the condition of step 1 at the start of the intake process. That is, only the medium-pressure valve V2 is opened among the valves in the pressure control unit 32. The high-pressure valve V1, the low-pressure valve V3, the first pressure-adjusting valve VH, and the second pressure-adjusting valve VL are closed. In order to first communicate the buffer volume 34 with the cylinder 12, the medium-pressure valve V2 is opened while the high-pressure valve V1 is closed. The displacer 14 is positioned at the low-temperature side of the cylinder 12 to supply the operating gas from the buffer volume 34 mainly into the upper room 20 of the cylinder 12. Thus, increasing the cylinder pressure PC is started. On the other hand, the buffer pressure PB starts to decrease from the first set pressure P1. The buffer pressure PB becomes its minimum value at the completion of step 1.

When a condition for switching the steps that is predetermined is satisfied, the opening/closing states of the valves are switched from step 1 to step 2. The condition for switching the steps may be determined based on the operating gas pressure and/or the elapsed time. The switching condition may be, for example, that the cylinder pressure PC is increased to a predetermined pressure, or that the buffer pressure PB is reduced to the predetermined pressure. Alternatively, the switching condition may be that a predetermined time elapses from the start of the intake process. In an embodiment where the controller controls the opening/closing of the valves individually, the controller switches the opening/closing states when the switching condition is satisfied. Alternatively, the valves are mechanistically incorporated (for example, into the rotary valve mechanism) so that each of the valves can be opened and closed under a condition for switching the steps that is determined in design. In the same manner, for example, the switching condition based on the operating gas pressure and/or the elapsed time can be applied to the switching of each of the steps described below.

In step 2, the high-pressure valve V1 and the first pressure-adjusting valve VH are opened. The medium-pressure valve V2, the low-pressure valve V3, and the second pressure-adjusting valve VL are closed. In other word, the high-pressure valve V1 and the first pressure-adjusting valve VH are switched from their closed state to open, and the medium-pressure valve V2 is switched from its open state to be closed. The low-pressure valve V3 and the second pressure-adjusting valve VL are still closed.

Therefore, the operating gas source of the cylinder 12 is switched from the buffer volume 34 to the compressor 30 to bring the high pressure PH of the compressor 30 into the cylinder 12. The cylinder pressure PC substantially becomes equal to the high pressure PH. Further, the buffer volume 34 is communicated with the high-pressure side of the compressor 30 to increase the buffer pressure PB to the second set pressure P2. The buffer pressure PB is thus increased to restore the amount of the buffer pressure PB that is reduced in step 1, and further adjusted to a high pressure exceeding the first set pressure P1. The second set pressure P2 is set higher than the average value PM of the low pressure PL and the high pressure PH of the compressor 30. The second set pressure P2 is the maximum value of the buffer pressure PB in the intake process. During the intake process, the buffer pressure PB is regulated within the relatively low-pressure range from the minimum pressure at the completion of step 1 to the second set pressure P2. Note that, in the example shown in the drawing, the average value of the first set pressure P1 and the second set pressure P2 is set at the average pressure PM of the compressor 30.

In step 3, only the high-pressure valve V1 is opened, i.e., the open state of the high-pressure valve V1 is continued. The first pressure-adjusting valve VH is switched from the open state to the closed state. The medium-pressure valve V2, the low-pressure valve V3, and the second pressure-adjusting valve VL are still closed. Note that step 2 may be switched to step 3 before the cylinder pressure PC reaches the high pressure PH. Further, the first pressure-adjusting valve VH may be switched from the open state to the closed state in the middle of step 3 before the intake process is completed.

Due to the closure of the first pressure-adjusting valve VH, the second pressure-adjusting valve VL, and the medium-pressure valve V2, the buffer pressure PB is kept at a constant pressure. The cylinder pressure PC is kept at a pressure substantially equal to the high pressure PH of the compressor 30. The displacer 14 moves from the low-temperature end to the high-temperature end of the cylinder 12 to maximize the volume of the expansion room 22 of the cylinder 12, mainly during step 3. Simultaneously, the operating gas at the room temperature is moved to pass through the regenerator 24 to be cooled. Thus, the expansion room 22 is filled with the cooled operating gas. In this way, the expansion room 22 is filled with the high-pressure operating gas and the intake process is completed.

The exhaust process is started. Although the start of the exhaust process matches the completion of the intake process in the example shown in the drawing, these may be different from each other. The exhaust process may be started after a predetermined time elapses from the time the intake process is completed. The initial condition of the operating gas pressure at the start of the exhaust process is that the buffer pressure PB is at the second set pressure P2, and the cylinder pressure PC is substantially equal to the high pressure PH of the compressor 30 because of the completion of the intake process.

In step 4, only the medium-pressure valve V2 is opened among the valves in the pressure control unit 32. The high-pressure valve V1, the low-pressure valve V3, the first pressure-adjusting valve VH, and the second pressure-adjusting valve VL are closed. In order to first communicate the buffer volume 34 with the cylinder 12, the medium-pressure valve V2 is opened while the low-pressure valve V3 is closed. The displacer 14 is positioned at the high-temperature side of the cylinder 12 to expand the operating gas and exhaust the gas from the expansion room 22 of the cylinder 12 into the buffer volume 34. Thus, reducing the cylinder pressure PC is started. The Simon expansion generates coldness and the temperature of the operating gas is decreased. On the other hand, the buffer pressure PB is further increased from the second set pressure P2 due to the gas flow from the cylinder 12. The buffer pressure PB at the completion of step 4 is the maximum value of the buffer pressure PB.

In step 5, the low-pressure valve V3 and the second pressure-adjusting valve VL are opened. The medium-pressure valve V2, the high-pressure valve V1, and the first pressure-adjusting valve VH are closed. In other words, the low-pressure valve V3 and the second pressure-adjusting valve VL are switched from the closed state to the open state. The medium-pressure valve V2 is switched from the open state to the closed state. The high-pressure valve V1 and the first pressure-adjusting valve VH are still closed.

Therefore, the operating gas source of the cylinder 12 is switched from the buffer volume 34 to the compressor 30 to expand the operating gas and exhaust the gas from the expansion room 22 of the cylinder 12 into the low-pressure side of the compressor 30. The cylinder pressure PC substantially becomes equal to the low pressure PL. Further, the buffer volume 34 is communicated with the low-pressure side of the compressor 30 to reduce the buffer pressure PB to the first set pressure P1. The reduced amount of the buffer pressure PB exceeds the amount of the buffer pressure PB increased in step 4. The first set pressure P1 is the minimum value of the buffer pressure PB in the exhaust process. During the exhaust process, the buffer pressure PB is regulated within the relatively high-pressure range from the maximum pressure at the completion of step 4 to the first set pressure P1.

In step 6, only the low-pressure valve V3 is opened, i.e., the open state of the low-pressure valve V3 is continued. The second pressure-adjusting valve VL is switched from the open state to the closed state. The medium-pressure valve V2, the high-pressure valve V1, and the first pressure-adjusting valve VH are still closed. Note that step 5 may be switched to step 6 before the cylinder pressure PC reaches the low pressure PL. Further, the second pressure-adjusting valve VL may be switched from the open state to the closed state in the middle of step 6 before the exhaust process is completed.

The buffer pressure PB is kept at a constant pressure because the first pressure-adjusting valve VH, the second pressure-adjusting valve VL, and the medium-pressure valve V2 are closed. The cylinder pressure PC is kept at a pressure substantially equal to the low pressure PL of the compressor 30. The displacer 14 moves from the high-temperature end to the low-temperature end of the cylinder 12 to minimize the volume of the expansion room 22 of the cylinder 12, mainly during step 6. The cooled operating gas is forced out of the expansion room 22 by the displacer 14, and passes through the regenerator 24 while cooling the regenerator 24. In this way, the low-pressure operating gas is exhausted from the expansion room 22 and the exhaust process is completed. The intake process is started again to repeat the thermal cycles.

Note that, although it is shown in FIG. 2 as if the same required time in length is allotted to each of the steps, it is only for the convenience of description. The required time for each step is optimally adjusted to implement a desired performance of refrigeration. Further, it is not necessary to simultaneously switch the opening/closing states of all of the valves when a step goes to the next step. Some valves can be opened or closed slightly earlier (or later) than the other valves. For example, it is not always necessary to open/close the high-pressure valve V1 (or the low-pressure valve V3) at the same time as when the first pressure-adjusting valve VH (or the second pressure-adjusting valve VL) is opened/closed.

Additionally, it may not be necessary to open the medium-pressure valve V2 at the starts of the intake process and the exhaust process. The medium-pressure valve V2 may be opened after the start of the intake process or the start of the exhaust process. Before the pressure of the cylinder 12 is sufficiently increased (or reduced), the differential pressure on the high-pressure valve V1 (or the low-pressure valve V3) may remain during the time period when the valve is open. Thus, it is considered that the differential pressure acting on the high-pressure valve V1 (or the low-pressure valve V3) can be reduced to a corresponding extent even if the medium-pressure valve V2 is temporarily opened in the middle of the intake process (or in the middle of the exhaust process). In that case, to avoid generating the flow opposite to the assumed flow direction between the buffer volume 34 and the cylinder 12, the medium-pressure valve V2 is preferably opened while the buffer pressure PB is higher (or lower) than the cylinder pressure PC in the intake process (or the exhaust process).

According to the above-mentioned embodiment, the buffer volume 34 is first communicated with the cylinder 12 at the start of the intake into the cylinder 12. Thus, the high-pressure valve V1 can be opened after the differential pressure acting on the valve is reduced. Further, the buffer pressure PB is adjusted in advance to a low pressure during the previous exhaust process of the cylinder 12. Thus, the differential pressure acting on the medium-pressure valve V2 is also reduced when the current intake process starts. Accordingly, the energy loss in the medium-pressure valve V2 caused when communicating the buffer volume 34 with the cylinder 12 can also be reduced.

Similarly, the buffer volume 34 is first communicated with the cylinder 12 at the start of the exhaust from the cylinder 12. Thus, the low-pressure valve V3 can be opened after the differential pressure acting on the valve is reduced. Further, the buffer pressure PB is adjusted in advance at a high pressure during the previous intake process of the cylinder 12. Thus, the differential pressure acting on the medium-pressure valve V2 is also reduced when the current exhaust process starts. Accordingly, the energy loss in the medium-pressure valve V2 caused when communicating the buffer volume 34 can be reduced.

Because the energy loss in the operating gas flow is reduced as described above, a power-saving compressor 30 can be adopted. Thus, a high energy-conservation cryogenic refrigerator 10 can be provided. Further, keeping the buffer volume 34 within the medium pressure range also contributes to the energy conservation in comparison with the case in which the buffer pressure is repeatedly increased to a maximum pressure level and reduced to a minimum pressure level of the compressor. Moreover, controlling the pressure of the buffer volume 34 can reduce the size of the buffer volume 34. Thus, the whole size of the cryogenic refrigerator 10 can be reduced in combination with downsizing of the compressor.

Figure 3:
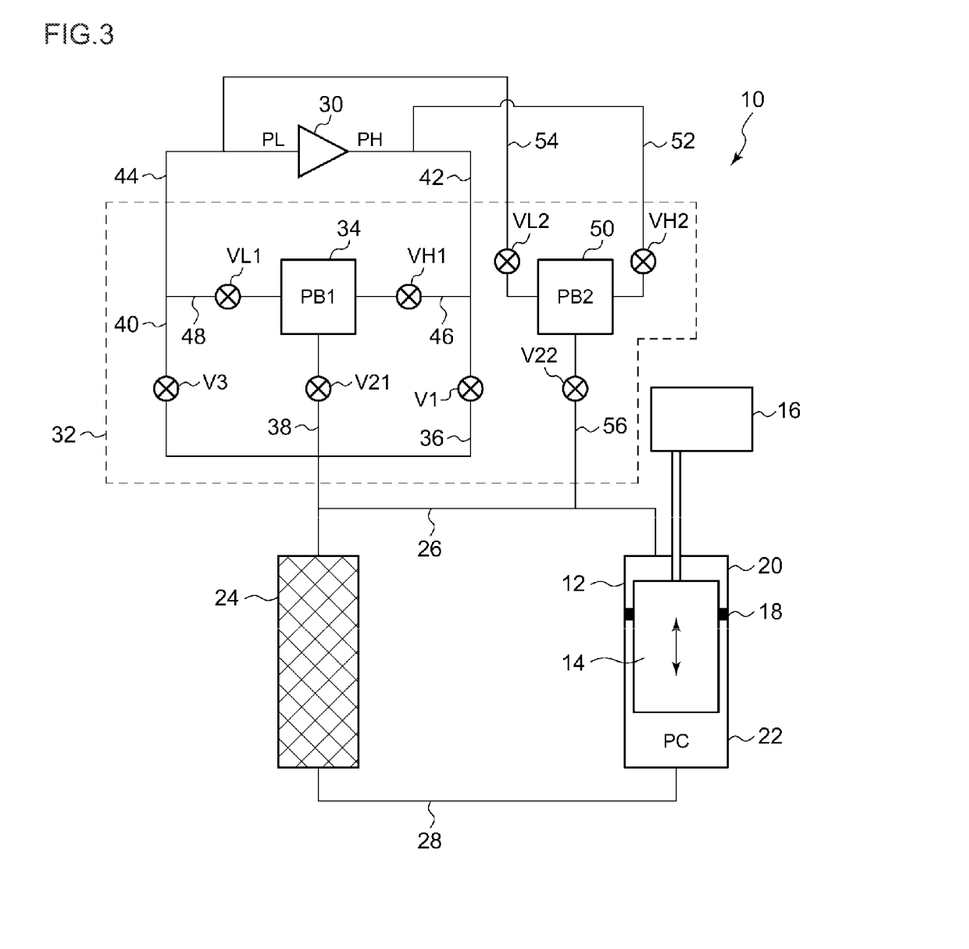
FIG. 3 is a schematic view illustrating the structure of a cryogenic refrigerator according to an embodiment of the present invention.

FIG. 3 is a schematic view illustrating the structure of a cryogenic refrigerator 10 according to another embodiment of the present invention. While the cryogenic refrigerator 10 shown in FIG. 1 has one buffer volume 34, the cryogenic refrigerator 10 shown in FIG. 3 has a plurality of buffer volumes. In the following description, the common components between the above-mentioned embodiment and the present embodiment are denoted with the same reference numerals, and the descriptions for the common components may be appropriately omitted for avoiding redundancy.

Further, the above-described modification relating to the embodiment shown in FIG. 1 may be applied to the embodiment shown in FIG. 3.

The pressure control unit 32 of the cryogenic refrigerator 10 includes a second buffer volume 50 in addition to a first buffer volume 34. In the same manner as the embodiment shown in FIG. 1, the first buffer volume 34 is communicated with the high-pressure side of the compressor 30 through the first communication path 46 and communicated with the low-pressure side of the compressor 30 through the second communication path 48. The first communication path 46 is provided with the first pressure-adjusting valve VH1, and the second communication path 48 is provided with the second pressure-adjusting valve VL1. A first medium-pressure valve V21 is provided in the first medium-pressure gas flow path 38 to communicate the first buffer volume 34 with the cylinder 12.

The second buffer volume 50 is positioned in parallel with the first buffer volume 34 and provided in the same arrangement as the first buffer volume 34. The second buffer volume 50 is communicated with the high-pressure side of the compressor 30 through a first communication path 52 and communicated with the low-pressure side of the compressor 30 through a second communication path 54. The first communication path 52 is provided with a first pressure-adjusting valve VH2, and the second communication path 54 is provided with a second pressure-adjusting valve VL2. A second medium-pressure valve V22 is provided in a second medium-pressure gas flow path 56 to communicate the second buffer volume 50 with the cylinder 12. The second medium-pressure gas flow path 56 is connected to the first gas flow path 26.

In an embodiment, a buffer pressure PB1 of the first buffer volume 34 is adjusted to have a different value from that of a buffer pressure PB2 of the second buffer volume 50. One of the pressures PB1 and PB2 is controlled to be higher than the other. For example, the average value of the buffer pressure PB1 of the first buffer volume 34 in a thermal cycle is set as PM+ΔP, and the average value of the buffer pressure PB2 of the second buffer volume 50 in a thermal cycle is set as PM−ΔP.

The buffer volumes are communicated with the cylinder 12 in ascending order of pressure in the intake process. On the other hand, the buffer volumes are communicated with the cylinder 12 in decreasing order of pressure in the exhaust process. This can further reduce the differential pressures acting on the high-pressure valve V1 and the low-pressure valve V3. This can also reduce the differential pressures acting on the medium-pressure valves V21 and V22.

Figure 4:
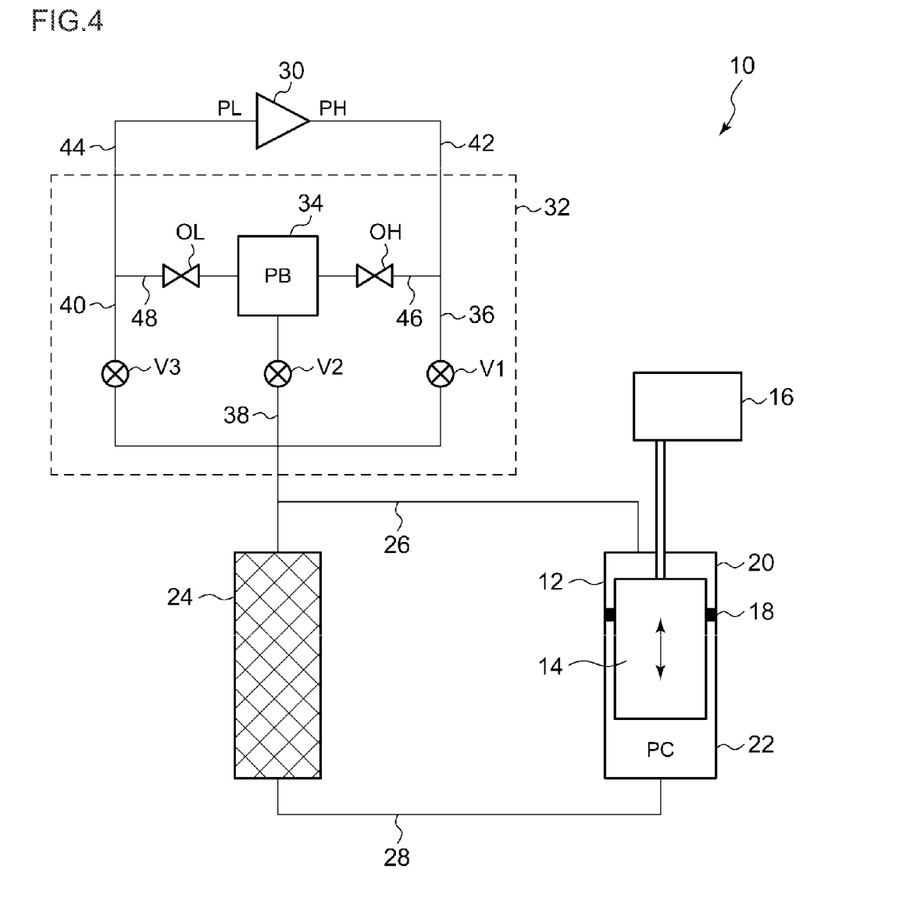
FIG. 4 is a schematic view illustrating the structure of a cryogenic refrigerator according to another embodiment of the present invention.

FIG. 4 is a schematic view illustrating the structure of a cryogenic refrigerator 10 according to a further embodiment of the present invention. While the cryogenic refrigerator 10 shown in FIG. 1 is provided with the first pressure-adjusting valve VH and the second pressure-adjusting valve VL as the flow adjuster, a cryogenic refrigerator 10 shown in FIG. 4 is provided with orifices as the flow adjuster. In the following description, the common components between the above-mentioned embodiments and the present embodiment are denoted with the same reference numerals, and the descriptions for the common components may be appropriately omitted for avoiding redundancy. Further, the above-described modifications relating to the embodiments shown in FIGS. 1 to 3 may be applied to the present embodiment.

As shown in FIG. 4, in place of the first pressure-adjusting valve VH and the second pressure-adjusting valve VL, a first pressure-adjusting orifice OH and a second pressure-adjusting orifice OL are provided. Using an orifice in place of a valve as the flow adjuster can simplify the structure of the pressure control unit 32. The first pressure-adjusting orifice OH is provided in the first communication path 46, and the second pressure-adjusting orifice OL is provided in the second communication path 48.

The opening degrees of the first pressure-adjusting orifice OH and the second pressure-adjusting orifice OL are preliminarily adjusted to operate in association with the buffer pressure PB. Specifically, the opening degrees of the orifices are set such that the flow rate of the first pressure-adjusting orifice OH exceeds that of the second pressure-adjusting orifice OL when the buffer pressure PB is lower than the set pressure PM. Also, the opening degrees of the orifices are set such that the flow rate of the first pressure-adjusting orifice OH matches that of the second pressure-adjusting orifice OL when the buffer pressure PB is equal to the set pressure PM. Further, the degrees of opening of the orifices are set such that the flow rate of the second pressure-adjusting orifice OL exceeds that of the first pressure-adjusting orifice OH when the buffer pressure PB is higher than the set pressure PM.

Note that either of the first pressure-adjusting orifice OH or the second pressure-adjusting orifice OL can be omitted. In this case, the communication path that does not have the orifice can also be omitted. In other words, the buffer volume 34 can be communicated with at least one of the high-pressure side and the low-pressure side of the compressor 30 through the communication path with the orifice. When only the first pressure-adjusting orifice OH is provided, the set pressure may be lower than the average pressure PM to adjust the pressure in a low-pressure range. When only the second pressure-adjusting orifice OL is provided, the set pressure may be higher than the average pressure PM to adjust the pressure in a high-pressure range.

Figure 5:
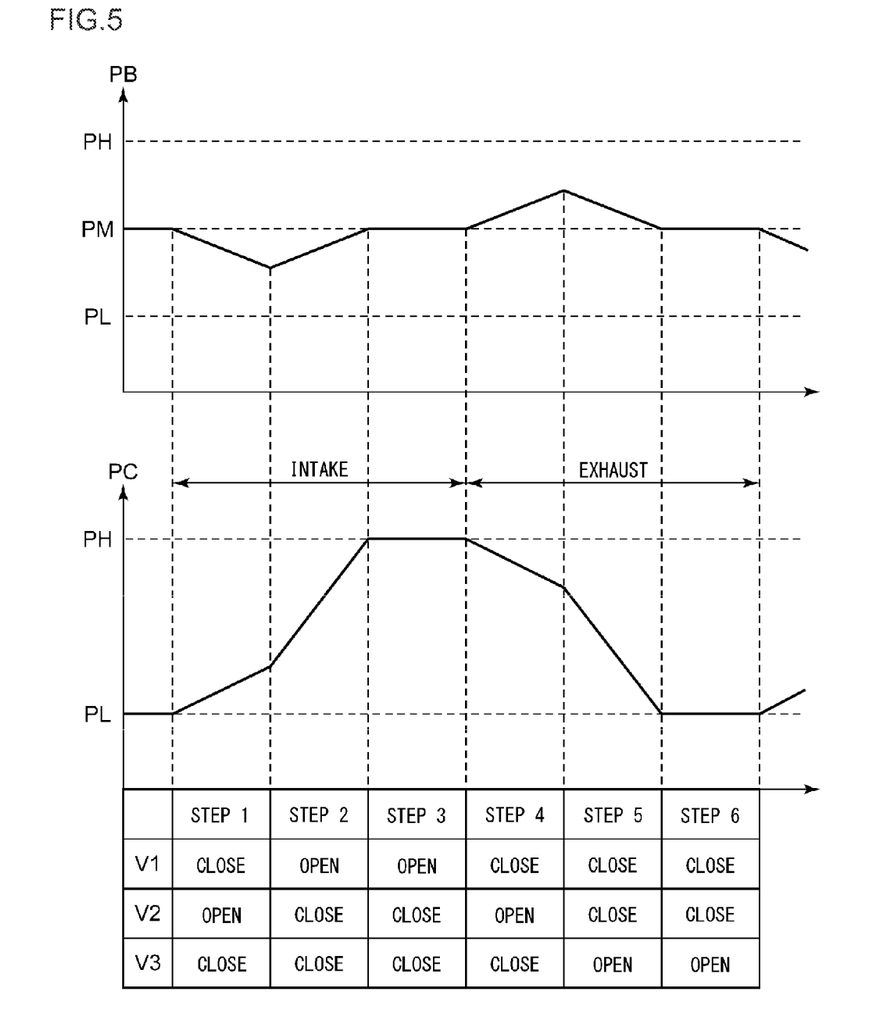
FIG. 5 is a schematic view illustrating an exemplary operation of the cryogenic refrigerator according to another embodiment of the present invention.

FIG. 5 is a schematic view illustrating an exemplary operation of the cryogenic refrigerator 10 shown in FIG. 4. An example of the opening/closing states of each valve in the pressure control unit 32 in a thermal cycle is shown at the lower part of FIG. 5. The variation of the buffer pressure PB and the variation of the cylinder pressure PC in time due to the changes of the opening/closing states are shown at the upper part and at the middle part of FIG. 5, respectively. As shown in the drawing, the opening/closing states of the valves are sequentially switched to six stages from the steps 1 to 6 in a cycle in this example. The first half of steps 1 to 3 corresponds to the intake process, and the second half of steps 4 to 6 corresponds to the exhaust process. The opening/closing states of the valves in step 2 are the same as those in step 3. The opening/closing states of the valves in step 5 are the same as those in step 6.

As shown in FIG. 5, the initial condition of the operating gas pressure at the start of the intake process is that the buffer pressure PB is at the average value PM and the cylinder pressure PC is substantially equal to the low pressure PL of the compressor 30 because the exhaust process is completed. In step 1, only the medium-pressure valve V2 is opened. The high-pressure valve V1 and the low-pressure valve V3 are closed. In order to first communicate the buffer volume 34 with the cylinder 12, the medium-pressure valve V2 is opened while the high-pressure valve V1 is closed. Thus, increasing the cylinder pressure PC is started. The displacer 14 is positioned at the low-temperature side of the cylinder 12 to supply the operating gas from the buffer volume 34 mainly into the upper room 20 of the cylinder 12.

Regardless of whether the medium-pressure valve V2 is opened or closed, the buffer volume 34 is communicated with the compressor 30 through the first pressure-adjusting orifice OH and the second pressure-adjusting orifice OL.

The flow rate of the medium-pressure valve V2 is set larger than the total of the flow rate from the first pressure-adjusting orifice OH and the flow rate out to the second pressure-adjusting orifice OL. Thus, the buffer pressure PB is reduced from the average value PM when the medium-pressure valve V2 is opened. The buffer pressure PB at the completion of step 1 is the minimum value of the buffer pressure PB.

In step 2, the high-pressure valve V1 is switched from the closed state to the open state, and the medium-pressure valve V2 is switched from the open state to the closed state. The low-pressure valve V3 is still closed. The operating gas source of the cylinder 12 is switched from the buffer volume 34 to the compressor 30 to bring the high pressure PH of the compressor 30 into the cylinder 12. The cylinder pressure PC becomes substantially equal to the high pressure PH. When the buffer pressure PB is lower than the average value PM, the flow rate of the first pressure-adjusting orifice OH is larger than that of the second pressure-adjusting orifice OL. Thus, the buffer pressure PB is increased to the average value PM through the first pressure-adjusting orifice OH and the second pressure-adjusting orifice OL. Therefore, the amount of the buffer pressure PB that has been reduced in step 1 is restored.

In step 3, only the high-pressure valve V1 is still opened. The medium-pressure valve V2 and the low-pressure valve V3 are still closed. When the buffer pressure PB is equal to the average value PM, the flow rate of the first pressure-adjusting orifice OH is equal to that of the second pressure-adjusting orifice OL. Thus, the buffer pressure PB is kept at a constant pressure. The cylinder pressure PC is substantially kept at the same as the high pressure PH of the compressor 30. The displacer 14 moves from the low-temperature end to the high-temperature end of the cylinder 12 to maximize the volume of the expansion room 22 of the cylinder 12, mainly in step 3. Simultaneously, the operating gas at the room temperature is moved to pass through the regenerator 24 to be cooled. Thus, the expansion room 22 is filled with the cooled operating gas. In this way, the expansion room 22 is filled with the high-pressure operating gas and the intake process is completed. In the intake process, the buffer pressure PB is regulated in the low-pressure range in which the average value PM serves as a boundary. The lower limit value of the low-pressure range is the minimum pressure of the buffer at the completion of step 1.

Next, the exhaust process is started. The buffer pressure PB is equal to the average value PM in the initial condition of the operating gas pressure at the start of the exhaust process. The cylinder pressure PC is substantially equal to the high pressure PH of the compressor 30 because of the completion of the intake process.

In step 4, only the medium-pressure valve V2 is opened. The high-pressure valve V1 and the low-pressure valve V3 are closed. In order to first communicate the buffer volume 34 with the cylinder 12, the medium-pressure valve V2 is opened while the low-pressure valve V3 is closed. The displacer 14 is positioned at the high-temperature side of the cylinder 12 to expand the operating gas and exhaust the gas from the expansion room 22 of the cylinder 12 into the buffer volume 34. In this way, reducing the cylinder pressure PC is started. The Simon expansion generates coldness and the temperature of the operating gas is decreased. On the other hand, the buffer pressure PB is increased from the average value PM because of the inflow from the cylinder 12. The buffer pressure PB at the completion of step 4 is the maximum value of the buffer pressure PB.

In step 5, the low-pressure valve V3 is switched from the closed state to the open state, and the medium-pressure valve V2 is switched from the open state to the closed state. The high-pressure valve V1 is still closed. The operating gas source of the cylinder 12 is switched from the buffer volume 34 to the compressor 30 to expand the operating gas and exhaust the gas from the expansion room 22 of the cylinder 12 into the low-pressure side of the compressor 30. The cylinder pressure PC becomes substantially equal to the low pressure PL. When the buffer pressure PB is higher than the average value PM, the flow rate of the second pressure-adjusting orifice OL is larger than that of the first pressure-adjusting orifice OH. Thus, the buffer pressure PB is reduced to the average value PM through the first pressure-adjusting orifice OH and the second pressure-adjusting orifice OL. Consequently, the amount of the buffer pressure PB that has been increased in step 4 is restored.

In step 6, only the low-pressure valve V3 is still opened. The medium-pressure valve V2 and the high-pressure valve V1 are still closed. The buffer pressure PB is kept at a constant pressure because the buffer pressure PB is equal to the average value PM. The cylinder pressure PC is kept at a pressure substantially equal to the low pressure PL of the compressor 30. The displacer 14 moves from the high-temperature end to the low-temperature end of the cylinder 12 to minimize the volume of the expansion room 22 of the cylinder 12, mainly in step 6. The cooled operating gas is forced out of the expansion room 22 by the displacer 14, and passes through the regenerator 24 while cooling the regenerator 24. In this way, the low-pressure operating gas is exhausted from the expansion room 22 and the exhaust process is completed. In the exhaust process, the buffer pressure PB is adjusted within the high-pressure range in which the average value PM serves as a boundary. The upper limit value of the high-pressure range is the maximum pressure of the buffer at the completion of step 4. The intake process is started again to repeat the thermal cycles.

The cryogenic refrigerator according to each of the above-mentioned embodiments can be used as a cooling source of a magnetic resonance imaging apparatus, a superconducting magnet unit, or a cryopump. Further, the cooling method according to each of the above-mentioned embodiments can be used as a cooling method suitable for a magnetic resonance imaging apparatus, a superconducting magnet unit, or a cryopump.

It should be understood that the invention is not limited to the above-described embodiment, but may be modified into various forms on the basis of the spirit of the invention. Additionally, the modifications are included in the scope of the invention.

What is claimed is:

1. A cooling method comprising a thermal cycle for generating coldness, the cycle comprising:
   an intake process of inhaling an operating gas from a high-pressure source into an expansion space; and
   an exhaust process of expanding the operating gas and exhausting the gas from the expansion space into a low-pressure source,
   wherein the intake process comprises a process of inhaling the gas from a medium-pressure source having a medium pressure between a pressure of the high-pressure source and a pressure of the low-pressure source into the expansion space,
   wherein, before the exhaust process is started, the medium-pressure source is disconnected from the expansion space and connected to the high-pressure source such that the pressure of the medium-pressure source is increased by inhaling the gas from the high-pressure source in order to reduce a differential pressure between the medium-pressure source and the expansion space.

2. A cooling method comprising a thermal cycle for generating coldness, the cycle comprising:
an intake process of inhaling an operating gas from a high-pressure source into an expansion space; and
an exhaust process of expanding the operating gas and exhausting the gas from the expansion space into a low-pressure source,
wherein the exhaust process comprises a process of exhausting the gas from the expansion space into a medium-pressure source having a medium pressure between a pressure of the high-pressure source and a pressure of the low-pressure source,
wherein, before the intake process is started, the medium-pressure source is disconnected from the expansion space and connected to the low-pressure source such that the pressure of the medium-pressure source is reduced by exhausting the gas into the low-pressure source in order to reduce a differential pressure between the medium-pressure source and the expansion space.

3. A cryogenic refrigerator comprising:
a cylinder configured to inhale an operating gas from a medium-pressure source into an expansion space of the cylinder before the expansion space is disconnected from the medium-pressure source and connected to a high-pressure source, the cylinder is configured to inhale the operating gas from the high-pressure source into the expansion space after the expansion space is connected to the high-pressure source,
wherein the cylinder is configured to expand the operating gas in the expansion space and to exhaust the operating gas from the expansion space to a low-pressure source after inhaling the operating gas from the high-pressure source into the expansion space, and
wherein the medium-pressure source is configured to inhale the operating gas from the high-pressure source before expanding the operating gas in the expansion space.

4. The cryogenic refrigerator according to claim 3, wherein a pressure of the operating gas from the medium-pressure source is between a pressure of the operating gas from the high-pressure source and a pressure of the operating gas from the low-pressure source.

5. The cryogenic refrigerator according to claim 4, wherein, before the expanding the operating gas in the expansion space, the medium-pressure source is disconnected from the expansion space and connected to the high-pressure source such that a pressure of the medium-pressure source is increased by inhaling the gas from the high-pressure source in order to reduce a differential pressure between the medium-pressure source and the expansion space.

6. The cryogenic refrigerator according to claim 3, further comprising:
a displacer movably arranged in the cylinder, the displacer is operative to provide intake of the operating gas into the cylinder and exhaust of the gas out of the cylinder.

7. The cryogenic refrigerator according to claim 3, further comprising:
a compressor configured to compress the operating gas, the compressor comprising a low-pressure side to receive the operating gas exhausted from the cylinder and a high-pressure side to discharge the operating gas compressed in the compressor into the cylinder.

8. The cryogenic refrigerator according to claim 7, further comprising:
a medium-pressure buffer volume connected to at least one of the high-pressure side and the low-pressure side.

9. The cryogenic refrigerator according to claim 7, further comprising:
a high-pressure gas flow path comprising a high-pressure valve configured to communicate the high-pressure side with the cylinder.

10. The cryogenic refrigerator according to claim 9, further comprising:
a low-pressure gas flow path comprising a low-pressure valve configured to communicate the low-pressure side with the cylinder.

11. The cryogenic refrigerator according to claim 10, further comprising:
at least one of a first communication path connecting the medium-pressure buffer volume to the high-pressure gas flow path and a second communication path connecting the medium-pressure buffer volume to the low-pressure gas flow path; and
a medium-pressure gas flow path comprising a medium-pressure valve configured to communicate the medium-pressure buffer volume with the cylinder.

12. The cryogenic refrigerator according to claim 11, further comprising:
a flow adjuster provided in the at least one of the first communication path and the second communication path and configured to adjust the pressure of the medium-pressure buffer volume.

13. The cryogenic refrigerator according to claim 11, further comprising:
a medium-pressure valve configured to communicate the medium-pressure buffer volume with the cylinder.

14. The cryogenic refrigerator according to claim 11, wherein the first communication path branches from the high-pressure gas flow path at a location between the high-pressure side of the compressor and the high-pressure valve and the second communication path branches from the low-pressure gas flow path at a location between the low-pressure side of the compressor and the low-pressure valve,
wherein the medium-pressure gas flow path merges the high-pressure gas flow path at a location between the high-pressure valve and the cylinder, the medium-pressure gas flow path merges the low-pressure gas flow path at a location between the low-pressure valve and the cylinder.

15. A cryogenic refrigerator comprising:
a cylinder configured to exhaust an operating gas from an expansion space of the cylinder to a medium-pressure source before the expansion space is disconnected from the medium-pressure source and connected to a low-pressure source, the cylinder is configured to exhaust the operating gas from the expansion space to the low-pressure source after the expansion space is connected to the low-pressure source,
wherein the cylinder is configured to inhale the operating gas from a high-pressure source into the expansion space after exhausting the operating gas from the expansion space to the low-pressure source, the cylinder is configured to expand the operating gas in the expansion space after inhaling the operating gas from the high-pressure source into the expansion space,
wherein the medium-pressure source is configured to exhaust the operating gas to the low-pressure source before inhaling the operating gas from the high-pressure source into the expansion space.

16. The cryogenic refrigerator according to claim 15, wherein a pressure of the operating gas from the medium-pressure source is between a pressure of the operating gas from the high-pressure source and a pressure of the operating gas from the low-pressure source.

17. The cryogenic refrigerator according to claim 16, wherein, before the inhaling the operating gas from the high-pressure source into the expansion space, the medium-pressure source is disconnected from the expansion space and connected to the low-pressure source such that a pressure of the medium-pressure source is reduced by exhausting the gas into the low-pressure source in order to reduce a differential pressure between the medium-pressure source and the expansion space.

18. The cryogenic refrigerator according to claim 15, further comprising:
a displacer movably arranged in the cylinder, the displacer is operative to provide intake of the operating gas into the cylinder and exhaust of the gas out of the cylinder.

19. The cryogenic refrigerator according to claim 15, further comprising:
a compressor configured to compress the operating gas, the compressor comprising a low-pressure side to receive the operating gas exhausted from the cylinder and a high-pressure side to discharge the operating gas compressed in the compressor into the cylinder.

20. The cryogenic refrigerator according to claim 19, further comprising:
a medium-pressure buffer volume connected to at least one of the high-pressure side and the low-pressure side.

21. The cryogenic refrigerator according to claim 19, further comprising:
a high-pressure gas flow path comprising a high-pressure valve configured to communicate the high-pressure side with the cylinder.

22. The cryogenic refrigerator according to claim 21, further comprising:
a low-pressure gas flow path comprising a low-pressure valve configured to communicate the low-pressure side with the cylinder.

23. The cryogenic refrigerator according to claim 22, further comprising:
at least one of a first communication path connecting the medium-pressure buffer volume to the high-pressure gas flow path and a second communication path connecting the medium-pressure buffer volume to the low-pressure gas flow path; and
a medium-pressure gas flow path comprising a medium-pressure valve configured to communicate the medium-pressure buffer volume with the cylinder.

24. The cryogenic refrigerator according to claim 23, further comprising:
a flow adjuster provided in the at least one of the first communication path and the second communication path and configured to adjust the pressure of the medium-pressure buffer volume.

25. The cryogenic refrigerator according to claim 23, further comprising:
a medium-pressure valve configured to communicate the medium-pressure buffer volume with the cylinder.

26. The cryogenic refrigerator according to claim 23, wherein the first communication path branches from the high-pressure gas flow path at a location between the high-pressure side of the compressor and the high-pressure valve and the second communication path branches from the low-pressure gas flow path at a location between the low-pressure side of the compressor and the low-pressure valve,
wherein the medium-pressure gas flow path merges the high-pressure gas flow path at a location between the high-pressure valve and the cylinder, the medium-pressure gas flow path merges the low-pressure gas flow path at a location between the low-pressure valve and the cylinder.

* * * * *